United States Patent
Bretthauer et al.

(10) Patent No.: US 10,249,583 B1
(45) Date of Patent: Apr. 2, 2019

(54) SEMICONDUCTOR DIE BOND PAD WITH INSULATING SEPARATOR

(71) Applicant: Infineon Technologies AG, Neubiberg (DE)

(72) Inventors: Christian Bretthauer, Munich (DE); Bernhard Laumer, Ottobrunn (DE); Holger Poehle, Taufkirchen (DE); Momtchil Stavrev, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/709,102

(22) Filed: Sep. 19, 2017

(51) Int. Cl.
*H01L 23/522* (2006.01)
*H01L 23/00* (2006.01)
(Continued)

(52) U.S. Cl.
CPC ............ *H01L 24/05* (2013.01); *H01L 23/528* (2013.01); *H01L 23/5226* (2013.01); *H01L 23/53219* (2013.01); *H01L 23/53228* (2013.01); *H01L 23/53233* (2013.01); *H01L 23/53242* (2013.01); *H01L 24/03* (2013.01); *H01L 24/45* (2013.01); *H01L 23/3171* (2013.01); *H01L 2224/034* (2013.01); *H01L 2224/03011* (2013.01); *H01L 2224/0361* (2013.01); *H01L 2224/0391* (2013.01); *H01L 2224/04042* (2013.01); *H01L 2224/05025* (2013.01); *H01L 2224/05073* (2013.01); *H01L 2224/05124* (2013.01); *H01L 2224/05147* (2013.01); *H01L 2224/05169* (2013.01); *H01L 2224/05546* (2013.01); *H01L 2224/05552* (2013.01); *H01L 2224/05553* (2013.01); *H01L 2224/05555* (2013.01); *H01L 2224/05559* (2013.01); *H01L 2224/05562* (2013.01); *H01L 2224/05573* (2013.01); *H01L 2224/05624* (2013.01); *H01L 2224/05647* (2013.01); *H01L 2224/45144* (2013.01); *H01L 2224/45164* (2013.01); *H01L 2924/3651* (2013.01); *H01L 2924/3656* (2013.01)

(58) Field of Classification Search
CPC ... H01L 24/05; H01L 23/5226; H01L 23/528; H01L 23/53219; H01L 23/53228; H01L 23/53233; H01L 23/53242; H01L 24/45
See application file for complete search history.

(56) References Cited

U.S. PATENT DOCUMENTS

| 5,541,524 A | * | 7/1996 | Tuckerman | ........ G01R 31/2863 324/750.07 |
| 2010/0123246 A1 | * | 5/2010 | Chen | ..................... H01L 23/585 257/738 |

(Continued)

*Primary Examiner* — Nathan W Ha
(74) *Attorney, Agent, or Firm* — Murphy, Bilak & Homiller, PLLC

(57) ABSTRACT

A semiconductor die includes a last metallization layer above a semiconductor substrate, a bond pad above the last metallization layer, a passivation layer covering part of the bond pad and having an opening that defines a contact area of the bond pad, an insulating region separating the bond pad from the last metallization layer at least in an area corresponding to the contact area of the bond pad, and an electrically conductive interconnection structure that extends from the bond pad to the upper metallization layer outside the contact area of the bond pad. Corresponding methods of manufacture are also provided.

20 Claims, 11 Drawing Sheets

(51) Int. Cl.
*H01L 23/532* (2006.01)
*H01L 23/528* (2006.01)
*H01L 23/31* (2006.01)

(56) References Cited

U.S. PATENT DOCUMENTS

| | | | | |
|---|---|---|---|---|
| 2010/0279501 | A1* | 11/2010 | Satake | H01L 22/32 |
| | | | | 438/612 |
| 2011/0175220 | A1* | 7/2011 | Kuo | H01L 21/76838 |
| | | | | 257/737 |
| 2013/0093061 | A1* | 4/2013 | Hisaka | H01L 23/3192 |
| | | | | 257/621 |
| 2013/0207254 | A1* | 8/2013 | Ossimitz | G11C 5/06 |
| | | | | 257/698 |
| 2013/0320522 | A1* | 12/2013 | Lai | H01L 24/05 |
| | | | | 257/737 |
| 2013/0320536 | A1* | 12/2013 | Cooney, III | H01L 23/5227 |
| | | | | 257/751 |
| 2014/0183757 | A1* | 7/2014 | Erwin | H01L 24/03 |
| | | | | 257/774 |
| 2014/0299887 | A1* | 10/2014 | Matocha | H01L 23/26 |
| | | | | 257/77 |
| 2015/0021758 | A1* | 1/2015 | Tsai | H01L 24/13 |
| | | | | 257/737 |
| 2017/0084529 | A1* | 3/2017 | Hsieh | H01L 23/49838 |

\* cited by examiner

SEMICONDUCTOR DIE BOND PAD WITH INSULATING SEPARATOR

TECHNICAL FIELD

The present application relates to semiconductor dies, in particular semiconductor dies with robust pond pad structures.

BACKGROUND

Bond pads provide points of external electrical connection/probing for a semiconductor die. Hard and chemically stable electroless-plated bond pads such as NiP pads in combination with 4N (99.99% pure) Au bondwires have been used for probing and bonding over active areas of a semiconductor die. However, the electroless plating process used to form such a hard bond pad is complex and expensive. Additionally, electroless-plated bond pads are prone to copper voids in the last metallization layer of the semiconductor die. As such, direct routing in the uppermost metallization layer is typically forbidden by design rule. Otherwise, the weak interface at the side of an electroless-plated bond pad allows copper migration to the surface of the bond pad which can lead to undesirable intermetallic phase growth.

AlCu bond pads have been used for automotive technologies. However, AlCu bond pads are highly prone to barrier cracks and thus have low robustness. Cracks caused by probing can be a significant reliability risk, depending on the type of product. For these products, additional probe pads are typically provided to accommodate wafer probing, which increases die size and therefore cost per die.

Hence, there is a need for a robust bond pad that can be produced in a lost-cost manner.

SUMMARY

According to an embodiment of a semiconductor die, the die comprises a last metallization layer above a semiconductor substrate, a bond pad above the last metallization layer, a passivation layer covering part of the bond pad and having an opening that defines a contact area of the bond pad, an insulating region separating the bond pad from the last metallization layer at least in an area corresponding to the contact area of the bond pad, and an electrically conductive interconnection structure that extends from the bond pad to the upper metallization layer outside the contact area of the bond pad.

According to an embodiment of a method of manufacturing a semiconductor die, the method comprises: forming a last metallization layer above a semiconductor substrate; forming a bond pad above the last metallization layer; covering part of the bond pad with a passivation layer, the passivation layer having an opening that defines a contact area of the bond pad; forming an insulating region for separating the bond pad from the last metallization layer at least in an area corresponding to the contact area of the bond pad; and forming an electrically conductive interconnection structure that extends from the bond pad to the upper metallization layer outside the contact area of the bond pad.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a robust and cost-effective bond pad for semiconductor dies. The bond pad described herein can be used for both probing over the active area of the die, and bonding over the active area. An insulating region separates the bond pad from the last (uppermost) metallization layer of the die at least in an area corresponding to the contact area of the bond pad, the contact area being the area of the bond pad that is probed and bonded. The insulating region ensures high mechanical robustness, and withstands over-probing within defined technological limits. An electrical connection between the bond pad and the last metallization layer of the die is realized outside the defined contact area of the bond pad. Even if the insulating separation region is damaged e.g. by misuse of bonding equipment, the separation region minimizes intermetallic phase formation between a bondwire attached to the bond pad and the underlying die metallization layer, ensuring resistance stability. High temperature stability e.g. of at least 3000 hours at 175° C. or higher is ensured by the use of the bond pad system disclosed herein in conjunction with e.g. a Pd-doped Au bondwire of 2N (99%) purity. The Pd additive reduces intermetallic phase growth between the bond pad and bondwire and reduces formation kinetics of Kirkendal-voids.

Figure 1:
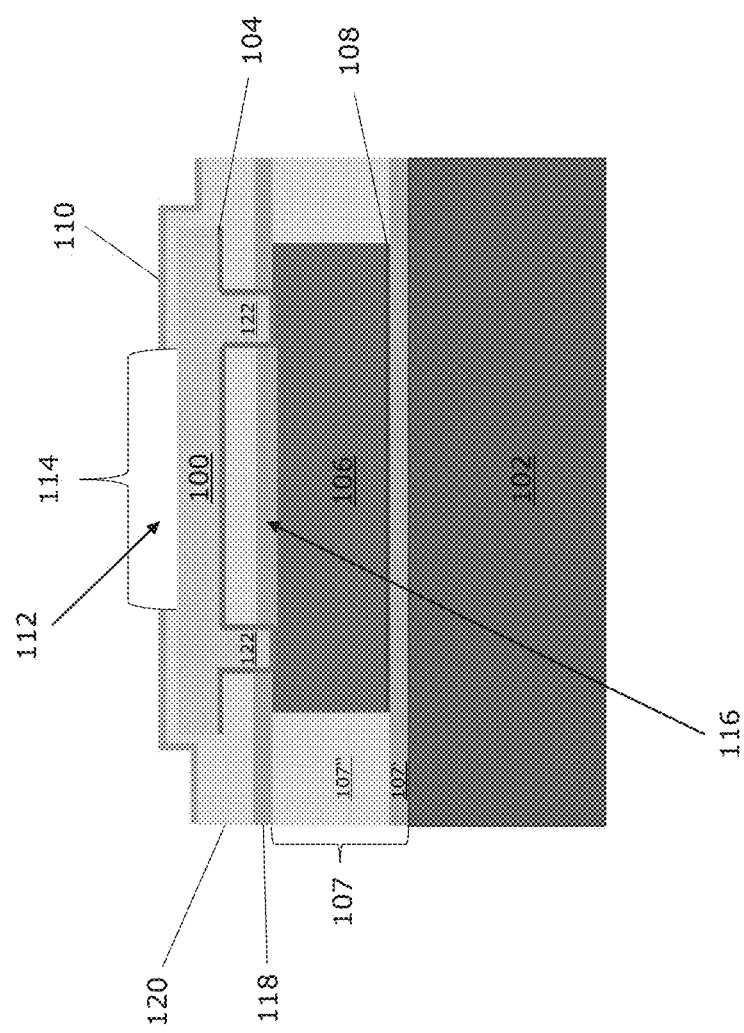
FIG. 1 illustrates a partial sectional view of an embodiment of a semiconductor die having a bond pad; an insulating region that separates the bond pad from a last metallization layer at least in an area corresponding to a contact area of the bond pad, and an electrically conductive interconnection structure that extends from the bond pad to the upper metallization layer outside the contact area of the bond pad.

FIG. 1 illustrates a partial sectional view of a semiconductor die having a robust and cost-effective bond 100. The semiconductor die also includes a semiconductor substrate 102. Any standard type of semiconductor substrate can be used such as single element semiconductors (e.g. Si, Ge, etc.), silicon-on-insulator semiconductors, binary semiconductors (e.g. SiC, GaN, GaAs, etc.), ternary semiconductors, etc. with or without epitaxial layer(s). The part of the semiconductor substrate 102 shown in FIG. 1 is an active area in which one or more devices such as transistors, diodes, etc. are formed. According to this embodiment, the bond pad 100 and corresponding liner 104 are formed over the active area of the semiconductor die. Additional bond pads can be formed, including outside the active area in a periphery or edge termination region of the die which is not shown in FIG. 1 for ease of illustration.

The semiconductor die further includes one or more structured metallization layers 106 formed above the semiconductor substrate 102. The semiconductor die typically includes a plurality of metallization layers. Only the last (uppermost) metallization layer 106 is shown in FIG. 1 for ease of illustration. Electrical connections between the active area of the semiconductor substrate 102 and the overlying metallization layer(s) 106 are formed by electrically conductive vias, which are out-of-view in FIG. 1. The last metallization layer 106 comprises a metal or metal alloy such as Cu, a Cu alloy, AlCu or Pt, and a corresponding seed layer or liner 108 such as one or more of Ta, W or Ti or alloys or nitrides thereof. The last metallization layer 106 has a thickness in a range of 0.5 microns to 5 microns in some embodiments, and is disposed in an interlayer dielectric 107 e.g. of nitride 107' such as SiN and oxide 107" such as $SiO_2$.

The bond pad 100 and corresponding liner 104 are disposed above the last metallization layer 106. A passivation layer 110 covers part of the bond pad 100, and has an opening 112 that defines a contact area 114 of the bond pad 100. The bond pad contact area 114 can be sized to account for expected intermetallic phase growth and bonding tolerance. The bond pad 100 can be probed and bonded at the contact area 114. An insulating region 116 separates the bond pad 100 from the last metallization layer 106 at least in an area corresponding to the contact area 114 of the bond pad 100. This way, the bond pad 100 is separated from the last metallization layer 106 by the insulating region 116 at least in the region of the contact area 114. The insulating region 116 can include one or more layers of insulating material. In one embodiment, the insulating region 116 comprises a nitride layer 118 such as SiN on the last metallization layer 106 and an oxide layer 120 such as $SiO_2$ on the nitride layer 118. In another embodiment, the insulating region 116 comprises AlNi or SIC. Still other types of insulating materials can be used for the insulating region 116.

An electrically conductive interconnection structure 122 extends from the bond pad 100 to the upper metallization layer 106 outside the contact area 114 of the bond pad 100, to electrically connect the bond pad 100 to the last metallization layer 106. The dimensions and layout of the electrically conductive interconnection structure 122 depend on the amount of current expected to flow through the bond pad 100.

Figure 2:
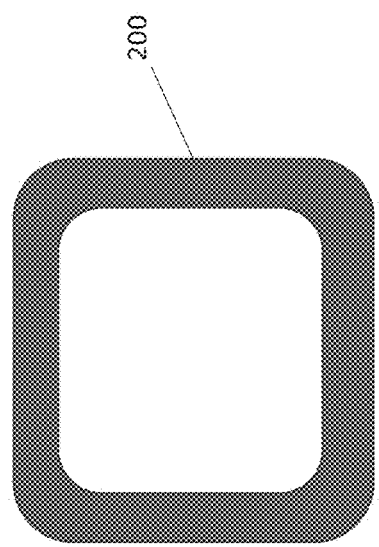
FIGS. 2 through 5 illustrate respective plan views of the electrically conductive interconnection structure, according to different embodiments.

FIG. 2 illustrates a top plan view of an embodiment of the electrically conductive interconnection structure 122. According to this embodiment, the connection structure 122 is a metal ring 200 that connects the bond pad 100 to the upper metallization layer 106 outside the contact area 114 of the bond pad 100.

Figure 3:
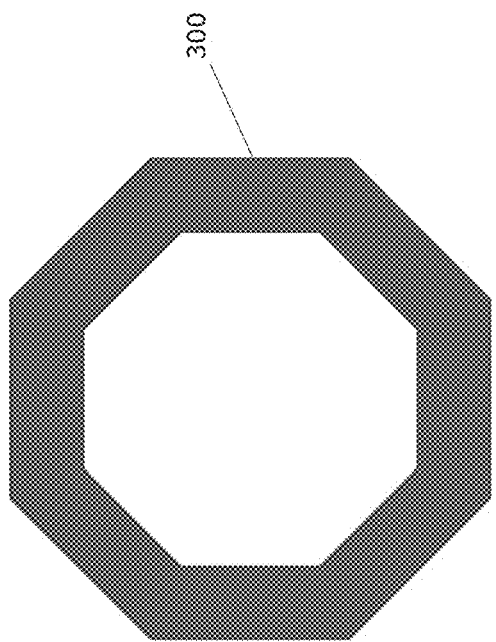

FIG. 3 illustrates a top plan view of another embodiment of the electrically conductive interconnection structure 122. According to this embodiment, the connection structure 122 is an octagon-shaped metal ring 300 that connects the bond pad to the upper metallization layer outside the contact area of the bond pad.

Figure 4:

FIG. 4 illustrates a top plan view of yet another embodiment of the electrically conductive interconnection structure 122. According to this embodiment, the connection structure 122 includes a plurality of electrically conductive vias 400 that connect the bond pad 100 to the upper metallization layer 106 outside the contact area 114 of the bond pad 100.

Figure 5:
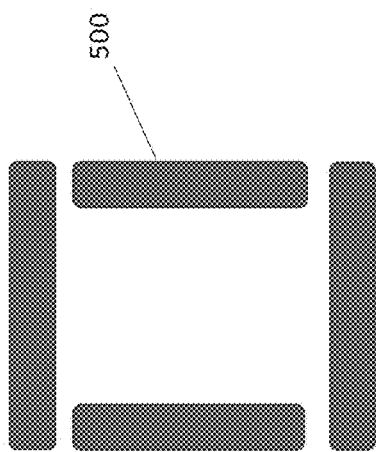

FIG. 5 illustrates a top plan view of still another embodiment of the electrically conductive interconnection structure 122. According to this embodiment, the connection structure 122 includes a plurality of metal bars 500 that connect the bond pad 100 to the upper metallization layer 106 outside the contact area 114 of the bond pad 100.

Other dimensions and layouts of the electrically conductive interconnection structure 122 are within the scope of the bond pad embodiments described herein.

As mentioned above, the bond pad 100 can be probed at the contact area 114 e.g. during wafer testing of the semiconductor die and other dies fabricated on the same semiconductor wafer.

Figure 6:
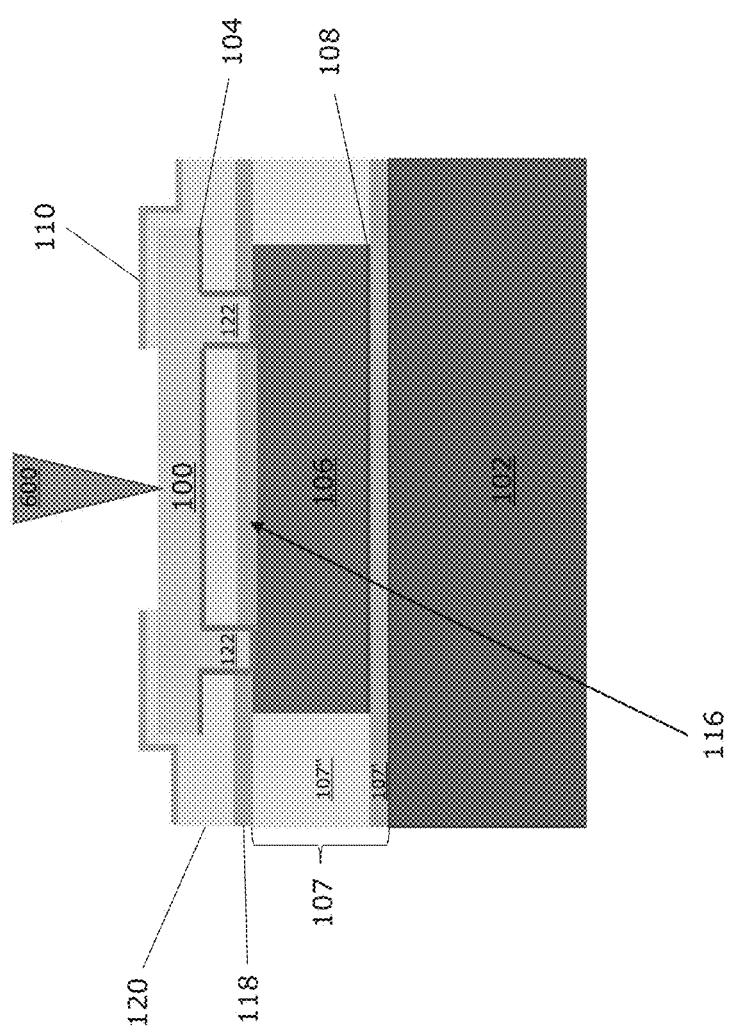
FIG. 6 illustrates the semiconductor die during probing of the bond pad.

FIG. 6 illustrates the bond pad 100 during probing. A wafer probe 600 is brought into contact with the bond pad 100 in the contact area 114. As described above, an insulating region 116 separates the bond pad 100 from the last metallization layer 106 at least in an area corresponding to the contact area 114 of the bond pad 100. This way, probing of the bond pad 100 over connection areas 122 to the underlying last metallization layer 106 is avoided. Also, in the case of over-probing, the insulating region 116 that separates the bond pad 100 from the last metallization layer 106 in the contact area 114 provides high robustness against crack formation. Even if a crack were to form in the bond pad liner 104 due to over-probing the bond pad contact area 114, subsequent intermetallic phase growth between constituent metal atoms of the bond pad 100 and constituent metal atoms of an electrical conductor bonded to the bond pad 100 is minimized by the presence of the insulating separator region 116. Also, copper or other metal migration from the last metallization layer 106 to the topside of the bond pad 100 via a crack formed in the liner 104 under the bond pad contact area 114 also is minimized by the presence of the insulating separator region 116.

Figure 7:
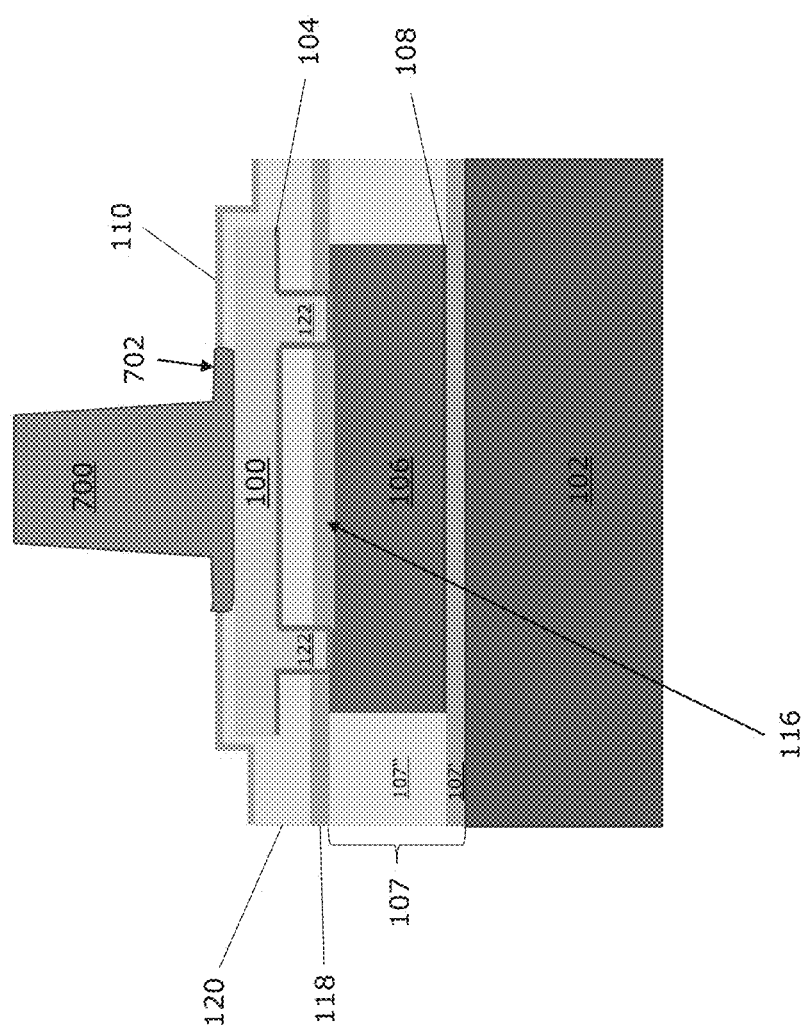
FIG. 7 illustrates the semiconductor die during wire bonding to the bond pad.

FIG. 7 illustrates the semiconductor die after an electrical conductor 700 such as a bondwire is bonded to the contact area 114 of the bond pad 100. In an embodiment, the bond pad 100 comprises AlCu and the electrical conductor 700 is a 2N (99% pure) Au bondwire. A so-called nail head 702 can form and expand laterally along the contact area 114 of the bond pad 100 due to Al/Au/Pd intermetallic phase growth. The amount of intermetallic phase growth is a function of the anneal conditions and amount of temperature stress. Other bond pad and electrical conductor material systems can be used, which can result in the same or similar nail head formation due to intermetallic phase growth between constituent metal atoms of the electrical conductor 700 and constituent metal atoms of the bond pad 100. The electrical conductor 700 can be doped with an additive such as Pd that suppresses the intermetallic phase growth between constituent metal atoms of the electrical conductor 700 and constituent metal atoms of the bond pad 100. Palladium (Pd) is particularly effective at slowing Au—Al phase growth and formation kinetics of Kirkendal-voids.

FIGS. 8A through 8F illustrate an embodiment of manufacturing the semiconductor die, with emphasis on forming the bond pad 100, the electrical interconnection structure 122 between the bond pad 100 and the last metallization layer 106, and the insulating region 116 that separates the bond pad 100 from the last metallization layer 106 at least in an area corresponding to the contact area 114 of the bond pad 100.

Figure 8A:
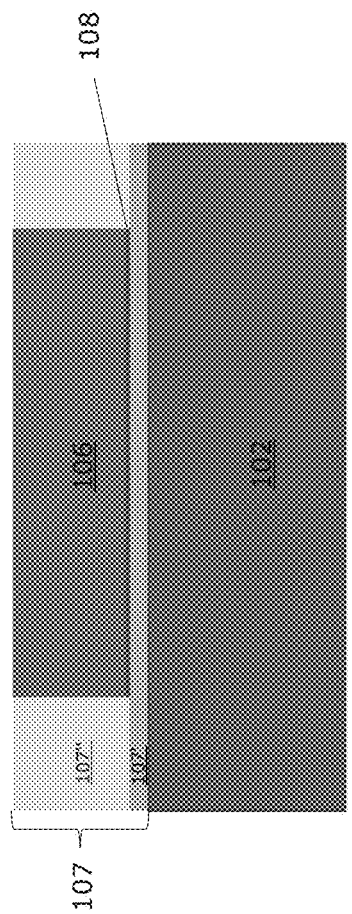
FIGS. 8A through 8F illustrate an embodiment of a method of manufacturing the semiconductor die.

In FIG. 8A, the last metallization layer 106 is formed above the semiconductor substrate 102. As mentioned above, one metallization layer 106 is shown in FIG. 8A. However, the semiconductor die typically includes a plurality of metallization layers. The last metallization layer 106 is separated from an underlying metallization layer or the semiconductor substrate 102 by an interlayer dielectric 107, illustrated in FIG. 8A as an oxide layer 107" such as $SiO_2$ on a nitride layer 107' such as SiN. Also as mentioned above, electrical connections between the active area of the semiconductor substrate 102 and the overlying metallization layer(s) 106 are formed by electrically conductive vias which are out-of-view in FIG. 8A. In an embodiment, the last metallization layer 107 is formed by depositing Cu, a Cu alloy, AlCu or Pt on a seed layer or liner 108.

Figure 8B:
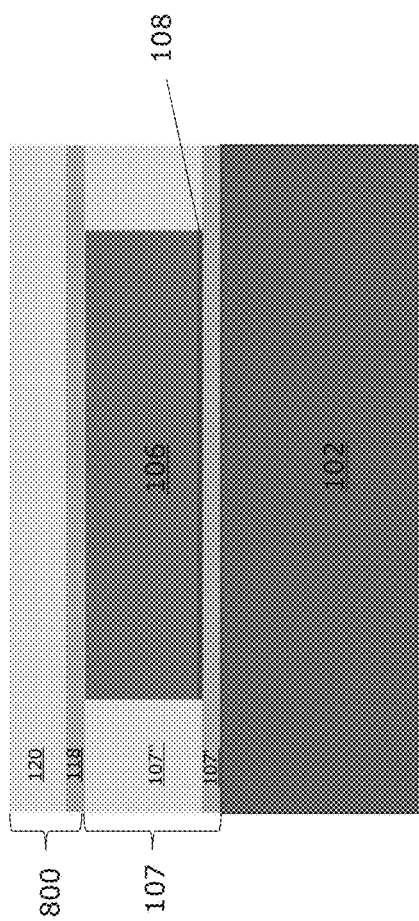

In FIG. 8B, an interlayer dielectric 800 is formed on the last metallization layer 106. In an embodiment, forming the interlayer dielectric 800 includes forming a nitride layer 118 such as SiN on the last metallization layer 106 and forming an oxide layer 120 such as $SiO_2$ on the nitride layer 118. In another embodiment, the interlayer dielectric 800 comprises AlNi or SiC formed on the last metallization layer 106. Still other types of standard insulating materials can be used for the interlayer dielectric 800 on formed on the last metallization layer 106.

Figure 8C:
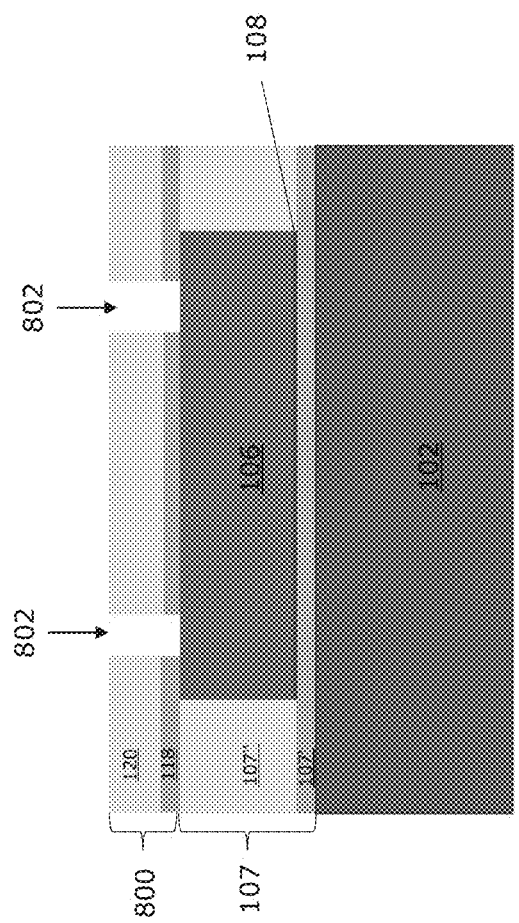

In FIG. 8C, one or more openings 802 are formed in the interlayer dielectric 800 disposed on the last metallization layer 106. The opening(s) 802 can be formed by standard wet or dry chemical etching, plasma etching, etc. The one or more openings 802 are used to form a subsequent electrical connection between the last metallization layer 106 and the bond pad 100, outside the contact area 114 of the bond pad 100. As described above, the interconnection structure 122 between the bond pad 100 and the last metallization layer 106 can include a metal ring as shown in FIGS. 2 and 3, a plurality of electrically conductive vias as shown in FIG. 4, a plurality of metal bars as shown in FIG. 5, etc. Hence, the number and shape of the openings 802 formed in the interlayer dielectric 800 depends on the dimensions and layout of the electrical interconnection structure 122 to be formed.

Figure 8D:
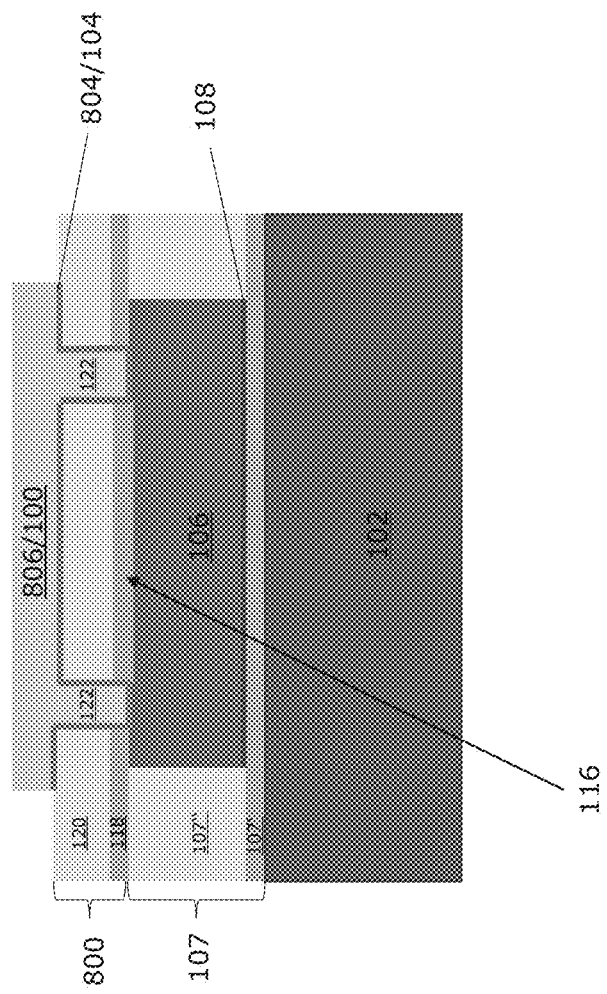

In FIG. 8D, a liner material 804 such as one or more of Ta, W or Ti or alloys or nitrides thereof is deposited on the interlayer dielectric 800 and a bond pad material 806 such as AlCu, Cu, etc, is deposited on the liner 804. The liner material 804 and bond pad material 806 fill each opening 802 previously formed in the interlayer dielectric 800. The liner material 804 and bond pad material 806 are then patterned e.g. using standard lithography and etching processes to form the bond pad 100 and corresponding liner 104. The liner material 804 and bond pad material 806 that remain filled in each opening 802 of the interlayer dielectric 800 form the electrically conductive interconnection structure 122 between the bond pad 100 and the last metallization layer 106, outside the contact area 114 of the bond pad 100. The part of the interlayer dielectric 800 directly under the bond pad contact area 144 and laterally confined by the electrically conductive interconnection structure 122 forms the insulating region 116 that separates the bond pad 100 from the last metallization layer 106 at least in an area corresponding to the bond pad contact area 114.

Figure 8E:
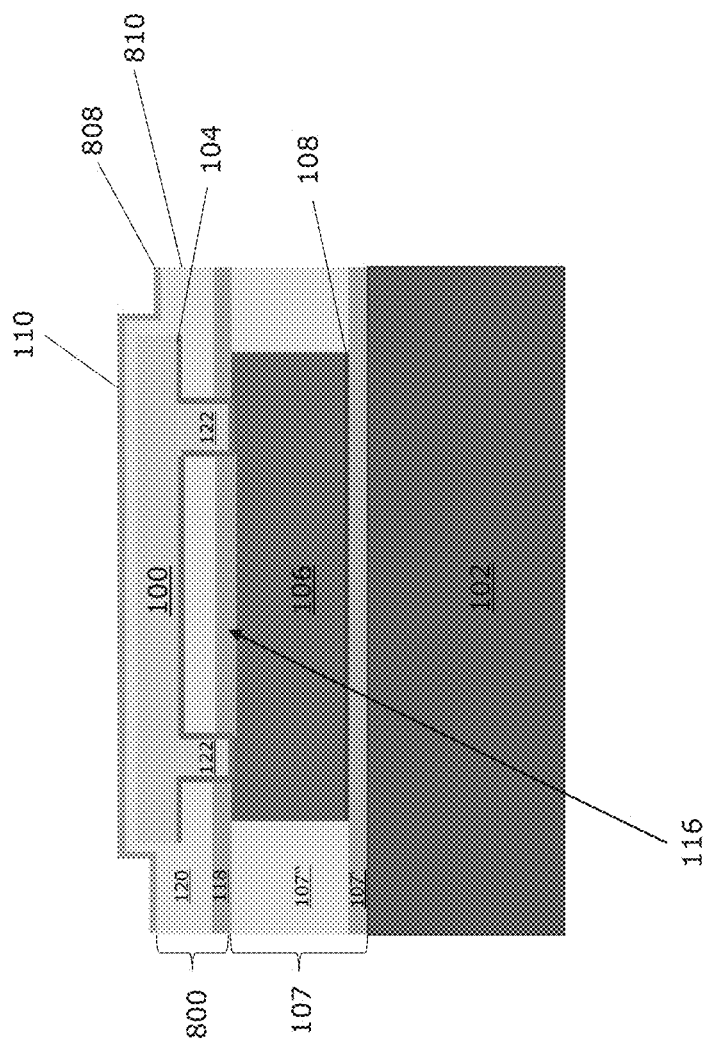

In FIG. 8E, a blanket passivation material 110 is formed over the die after forming the last metallization layer 106, the insulating region 116, the bond pad 100 and the electrically conductive interconnection structure 122 between the bond pad 100 and the last metallization layer 106. The blanket passivation 110 can include a layer of nitride 808 such as SiN on a layer of oxide 810 such as $SiO_2$.

Figure 8F:
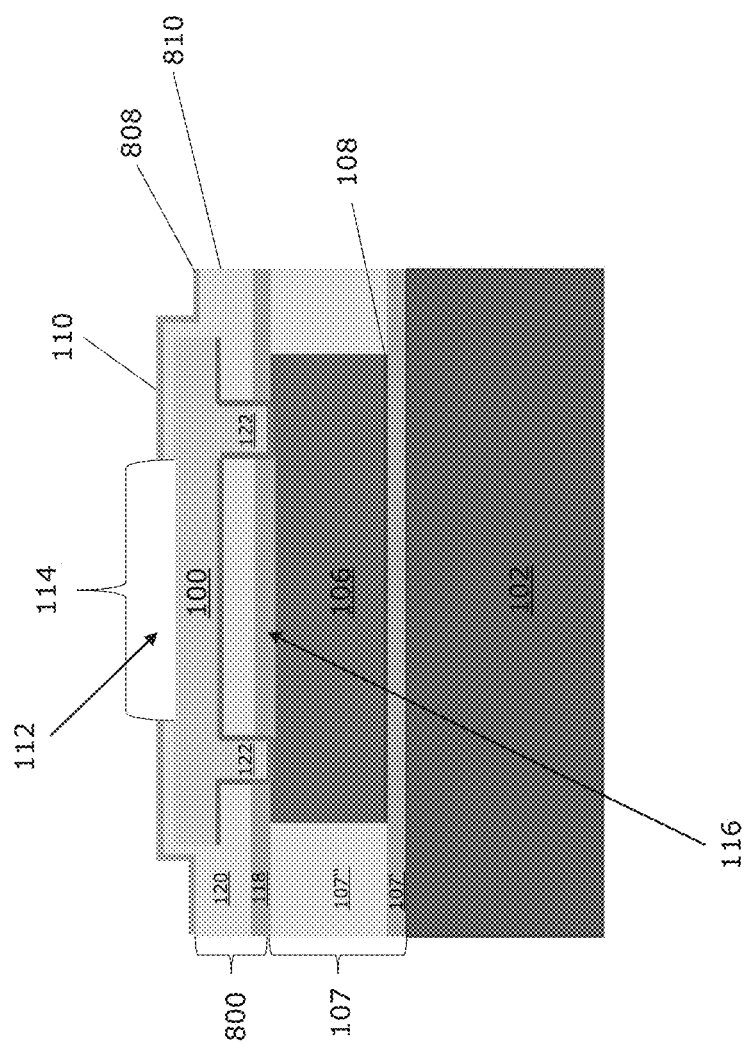

In FIG. 8F, an opening 112 is formed in the blanket passivation material 110 e.g. by standard lithography and etching. The opening 112 in the blanket passivation material 110 defines the contact area 114 of the bond pad 100. The opening 112 in the blanket passivation material 110 is narrower than the insulating region 116 laterally confined by the electrically conductive interconnection structure 122 and which separates the bond pad 100 from the last metallization layer 106.

The bond pad contact area 114 can then be probed, e.g. during wafer testing as shown in FIG. 6. An electrical conductor can be bonded to the contact area 114 of the bond pad 100 e.g. as shown in FIG. 7. In an embodiment, the bond pad 100 comprises AlCu and the electrical conductor is a 2N Au bondwire doped with Pd. The electrical conductor can be doped with an additive such as Pd in the case of a 2N Au bondwire, for suppressing intermetallic phase growth between constituent metal atoms of the electrical conductor and constituent metal atoms of the bond pad 100.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:
1. A semiconductor die, comprising:
a last metallization layer above a semiconductor substrate;
a bond pad above the last metallization layer;
a passivation layer covering part of the bond pad and having an opening that defines a contact area of the bond pad;
an insulating region separating the bond pad from the last metallization layer at least in an area corresponding to the contact area of the bond pad; and
an electrically conductive interconnection structure that extends from the bond pad to the last metallization layer outside the contact area of the bond pad.

2. The semiconductor die of claim 1, wherein the last metallization layer comprises Cu, a Cu alloy, AlCu or Pt.

3. The semiconductor die of claim 1, wherein the last metallization layer has a thickness in a range of 0.5 microns to 5 microns.

4. The semiconductor die of claim 1, wherein the electrically conductive interconnection structure comprise a plurality of electrically conductive vias that connect the bond pad to the last metallization layer outside the contact area of the bond pad.

5. The semiconductor die of claim 1, wherein the electrically conductive interconnection structure comprise a metal ring that connects the bond pad to the last metallization layer outside the contact area of the bond pad.

6. The semiconductor die of claim 1, wherein the electrically conductive interconnection structure comprise a plurality of metal bars that connect the bond pad to the last metallization layer outside the contact area of the bond pad.

7. The semiconductor die of claim 1, further comprising an electrical conductor bonded to the contact area of the bond pad.

8. The semiconductor die of claim 7, wherein the bond pad comprises AlCu, and wherein the electrical conductor is a 2N Au bondwire doped with Pd.

9. The semiconductor die of claim 7, wherein the electrical conductor comprises an additive for suppressing intermetallic phase growth between constituent metal atoms of the electrical conductor and constituent metal atoms of the bond pad.

10. The semiconductor die of claim 1, wherein the insulating region comprises a nitride layer on the last metallization layer and an oxide layer on the nitride layer.

11. The semiconductor die of claim 1, wherein the insulating region comprises AlNi or SiC.

12. A method of manufacturing a semiconductor die, the method comprising:
    forming a last metallization layer above a semiconductor substrate;
    forming a bond pad above the last metallization layer;
    covering part of the bond pad with a passivation layer, the passivation layer having an opening that defines a contact area of the bond pad;
    forming an insulating region for separating the bond pad from the last metallization layer at least in an area corresponding to the contact area of the bond pad; and
    forming an electrically conductive interconnection structure that extends from the bond pad to the last metallization layer outside the contact area of the bond pad.

13. The method of claim 12, wherein forming the last metallization layer comprises depositing Cu, a Cu alloy, AlCu or Pt.

14. The method of claim 12, wherein forming the electrically conductive interconnection structure comprises forming one of:
    a plurality of electrically conductive vias that connect the bond pad to the last metallization layer outside the contact area of the bond pad;
    a metal ring that connects the bond pad to the last metallization layer outside the contact area of the bond pad; and
    a plurality of metal bars that connect the bond pad to the last metallization layer outside the contact area of the bond pad.

15. The method of claim 12, further comprising bonding an electrical conductor to the contact area of the bond pad.

16. The method of claim 15, wherein the bond pad comprises AlCu, and wherein the electrical conductor is a 2N Au bondwire doped with Pd.

17. The method of claim 15, further comprising doping the electrical conductor with an additive for suppressing intermetallic phase growth between constituent metal atoms of the electrical conductor and constituent metal atoms of the bond pad.

18. The method of claim 12, wherein forming the insulating region comprises:
    forming a nitride layer on the last metallization layer; and
    forming an oxide layer on the nitride layer.

19. The method of claim 12, wherein forming the insulating region comprises forming AlNi or SiC on the last metallization layer.

20. The method of claim 12, wherein covering part of the bond pad with the passivation layer comprises:
    depositing a blanket passivation material after forming the last metallization layer, the insulating region, the bond pad and the electrically conductive interconnection structure; and
    forming an opening in the blanket passivation material that defines the contact area of the bond pad, the opening in the blanket passivation material being narrower than the insulating region as defined by the electrically conductive interconnection structure.

* * * * *